United States Patent
Sasaki

(10) Patent No.: US 10,297,783 B2
(45) Date of Patent: May 21, 2019

(54) DISPLAY DEVICE WITH MOISTURE PROTECTION AND METHOD FOR MANUFACTURING THE SAME

(71) Applicant: Japan Display Inc., Tokyo (JP)

(72) Inventor: Yusuke Sasaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/786,648

(22) Filed: Oct. 18, 2017

(65) Prior Publication Data

US 2018/0123082 A1 May 3, 2018

(30) Foreign Application Priority Data

Nov. 1, 2016 (JP) ................................. 2016-214570

(51) Int. Cl.
*H01L 51/52* (2006.01)
*H01L 27/32* (2006.01)
*H01L 51/50* (2006.01)

(52) U.S. Cl.
CPC ........ *H01L 51/5237* (2013.01); *H01L 27/326* (2013.01); *H01L 27/3248* (2013.01); *H01L 27/3258* (2013.01); *H01L 51/504* (2013.01); *H01L 51/5246* (2013.01); *H01L 51/5253* (2013.01); *H01L 27/3244* (2013.01)

(58) Field of Classification Search
CPC ............. H01L 51/5237; H01L 51/5253; H01L 51/504; H01L 51/5246; H01L 27/3258; H01L 27/3248; H01L 27/326
See application file for complete search history.

(56) References Cited

U.S. PATENT DOCUMENTS

| | | | |
|---|---|---|---|
| 2003/0038321 A1* | 2/2003 | Sakakura | G02F 1/136227 257/347 |
| 2004/0004777 A1* | 1/2004 | Takehisa | G02B 5/0808 359/883 |
| 2005/0023969 A1* | 2/2005 | Omata | H01L 27/3246 313/504 |
| 2006/0132033 A1* | 6/2006 | Maeda | H01L 51/56 313/512 |
| 2010/0295759 A1* | 11/2010 | Tanaka | H01L 51/5256 345/76 |
| 2015/0084025 A1 | 3/2015 | Horiguchi | |

FOREIGN PATENT DOCUMENTS

JP 2015-065025 A 4/2015

* cited by examiner

*Primary Examiner* — Allen L Parker
*Assistant Examiner* — Gustavo G Ramallo
(74) *Attorney, Agent, or Firm* — TYPHA IP LLC

(57) ABSTRACT

A display device includes a first inorganic insulating layer covering a display region; a first organic insulating layer on the first inorganic insulating layer; a second organic insulating layer covering the first organic insulating layer; and a second inorganic insulating layer covering the second organic insulating layer, the second inorganic insulating layer including a region in contact with the first inorganic insulating layer. An end of the first organic insulating layer and an end of the second organic insulating layer each have a tapering shape, the first organic insulating layer has a first side surface and a first bottom surface, the second organic insulating layer has a second side surface and a second bottom surface, and an angle made by the second side surface and the second bottom surface is smaller than an angle made by the first side surface and the first bottom surface.

16 Claims, 15 Drawing Sheets

DISPLAY DEVICE WITH MOISTURE PROTECTION AND METHOD FOR MANUFACTURING THE SAME

CROSS REFERENCE TO RELATED APPLICATIONS

This application is based upon and claims the benefit of priority from the prior Japanese Patent Application No. 2016-214570, filed on Nov. 1, 2016, the entire contents of which are incorporated herein by reference.

FIELD

An embodiment according to the present invention relates to a display device and a method for manufacturing the display device.

BACKGROUND

As display devices which are usable for electric appliances and electronic devices, a liquid crystal display device using an electro-optical effect of a liquid crystal material and an organic EL (electroluminescence) display device including an organic electroluminescence (EL) element have been developed. Especially, a display device including an organic EL element used as a display element has a wide viewing angle and provides high definition display.

It is known that in the case where an organic EL element is used as a display element, an organic EL layer is deteriorated by moisture. When the display device is driven by use of such a deteriorated organic EL layer, the luminance may be decreased or a display failure may occur. In order to prevent the organic EL layer from being contaminated with moisture, a sealing layer is provided. Japanese Laid-Open Patent Publication No. 2015-65025 discloses a sealing layer including a stack of an inorganic insulating layer, an organic insulating layer and an inorganic insulating layer.

SUMMARY

A display device in an embodiment according to the present invention includes a first inorganic insulating layer covering a display region; a first organic insulating layer on the first inorganic insulating layer; a second organic insulating layer covering the first organic insulating layer; and a second inorganic insulating layer covering the second organic insulating layer, the second inorganic insulating layer including a region in contact with the first inorganic insulating layer. An end of the first organic insulating layer and an end of the second organic insulating layer each have a tapering shape, the first organic insulating layer has a first side surface located at the end of the first organic insulating layer and a first bottom surface in direct contact with a layer below the first organic insulating layer, the second organic insulating layer has a second side surface located at the end of the second organic insulating layer and a second bottom surface in direct contact with a layer below the second organic insulating layer, and an angle made by the second side surface and the second bottom surface is smaller than an angle made by the first side surface and the first bottom surface.

A method for manufacturing a display device in an embodiment according to the present invention includes forming a first inorganic insulating layer such that the first inorganic insulating layer covers a display region, forming a first organic insulating layer on the first inorganic insulating layer, the first organic insulating layer being formed of a first organic material, forming a second organic insulating layer on the first organic insulating layer such that the second organic insulating layer covers the first organic insulating layer, the second organic insulating layer being formed of a second organic material having a viscosity lower than a viscosity of the first organic material, and forming a second inorganic insulating layer covering such that the second inorganic insulating layer covers the second organic insulating layer.

DESCRIPTION OF EMBODIMENTS

Figure 1:
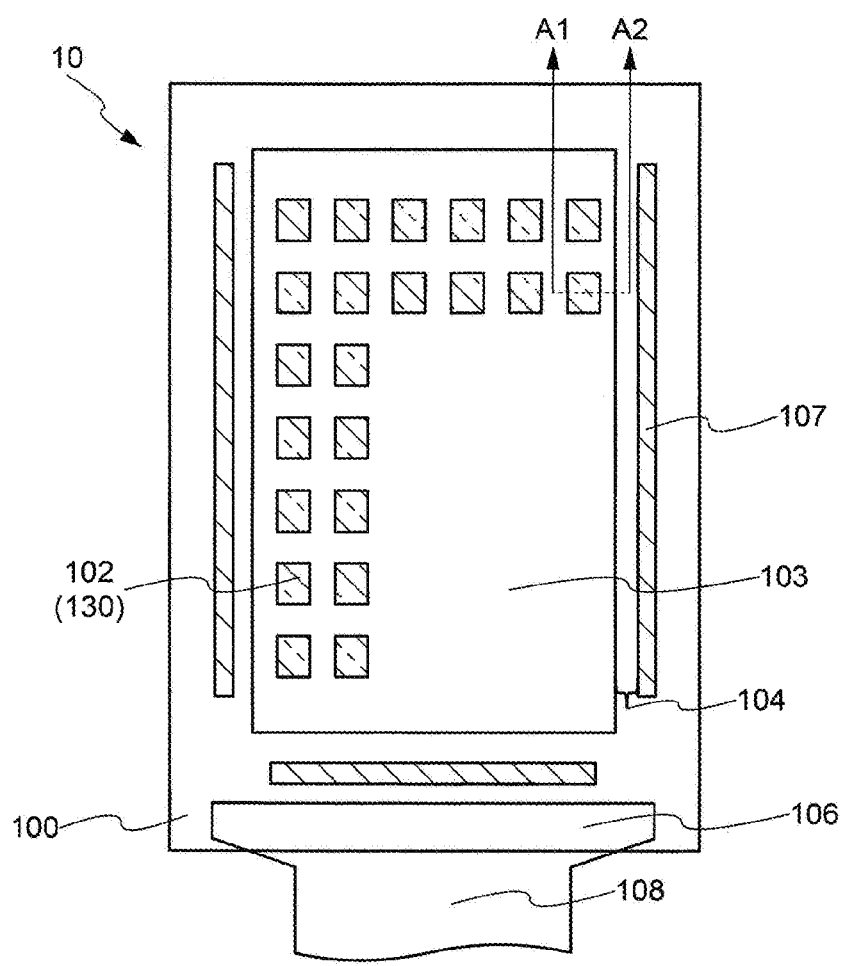
FIG. 1 is a plan view showing a structure of a display device in an embodiment according to the present invention.

Hereinafter, embodiments according to the present invention will be described with reference to the drawings. This disclosure merely provides an example, and modifications or alterations thereof readily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes, for the sake of clearer illustration. The drawings are merely examples and do not limit the interpretations of the present invention in any way.

In the specification and the drawings, components that have substantially the same functions as those described before with reference to a previous drawing(s) bear the identical reference signs thereto, and detailed descriptions thereof may be omitted. The words "first", "second" or the like provided for components are used merely to distinguish the components from each other, and do not have any further meaning unless otherwise specified.

In the specification and the claims, an expression that a component or a region is "on" another component or region encompasses a case where such a component or region is in direct contact with the another component or region and also a case where such a component is above or below the another component or region, namely, a case where still another component or region is provided between such a component or region and the another component or region, unless otherwise specified. In the following description, unless otherwise specified, the side on which a display element is provided with respect to a first substrate as seen in a cross-sectional view will be referred to as "above" or "front surface", and the opposite side will be referred to as "below" or "rear surface".

<Embodiment 1>

1-1. Structure of the Display Device

FIG. 1 is a plan view of a display device 10 in an embodiment according to the present invention. As shown in FIG. 1, the display device 10 includes a substrate 100, a display region 103 including a plurality of pixels 102, a peripheral region 104, a driving circuit 106 having a function of a source driver, a driving circuit 107 having a function of a gate driver, and a flexible printed circuit board 108. In the display device 10, the display region 103, the driving circuit 106, the driving circuit 107 and the flexible printed circuit board 108 are electrically connected with each other. The driving circuit 106, the driving circuit 107 are each formed of an integrated circuit such as an ASIC (Application Specific Integrated Circuit) or the like. The display device 10 is operated as follows. An external video signal is input to the display device 10 via the flexible printed circuit board 108, and thus the driving circuit 106 and the driving circuit 107 drive the pixels 102 each including a display element 130. As a result, a still image or a moving image is displayed in the display region 103.

Figure 2:
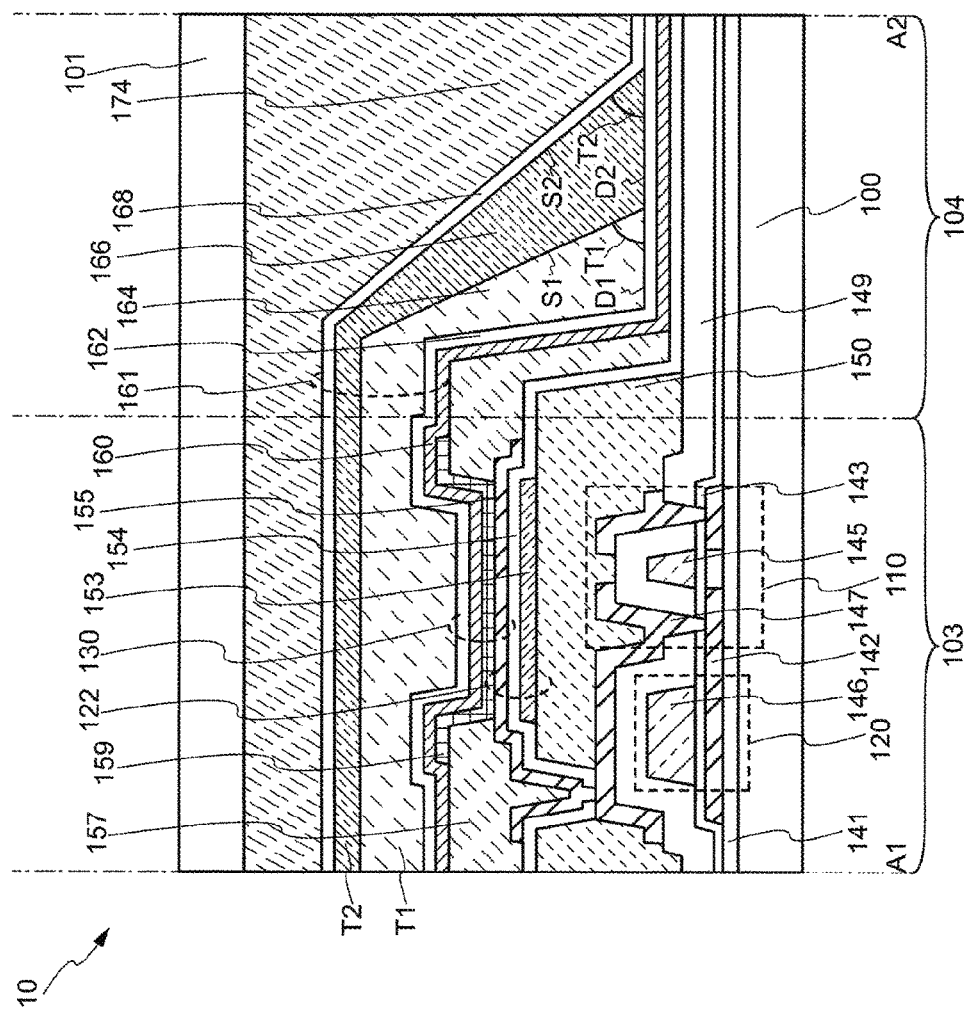
FIG. 2 is a cross-sectional view showing a structure of the display device in an embodiment according to the present invention.

FIG. 2 is a cross-sectional view of the display device 10 taken along line A1-A2 in FIG. 1. More specifically, FIG. 2 shows the display region 103 and the peripheral region 104. As shown in FIG. 2, the display device 10 includes a first substrate 100, an insulating layer 141, a transistor 110, a capacitance element 120, a capacitance element 122, the display element 130, an insulating layer 149, an insulating layer 150, a conductive layer 153, an insulating layer 154, a rib 157, a sealing layer 161, a filling member 174, and a second substrate 101.

1-2. Structure of the Sealing Layer

In the display device 10, the sealing layer 161 includes a first inorganic insulating layer 162, a first organic insulating layer 164, a second organic insulating layer 166, and a second inorganic insulating layer 168. Hereinafter, each of these layers will be described.

Generally in a sealing layer, an organic insulating layer also acts as a flattening layer and is formed to be thick. In a step of forming the organic insulating layer by an application method, the material of the organic insulating layer may not be applied to a part of the layer or the like on which the organic insulating layer is to be formed, or the material of the organic insulating layer may be applied excessively on a part of the layer or the like. Such a fault in the application of the material results in formation of a rugged surface of the organic insulating layer. When this occurs, the display region may have a defective external appearance, or an inorganic insulating layer on the organic insulating layer may be defective.

The first inorganic insulating layer 162 covers the display region 103. The first inorganic insulating layer 162 has a function of preventing entrance of moisture to the display region 103. The first inorganic insulating layer 162 is formed of an inorganic insulating material. Such an inorganic insulating material is one or a plurality of materials selected from aluminum oxide, magnesium oxide, silicon oxide, silicon oxide nitride, silicon nitride oxide, and silicon nitride. The first inorganic insulating layer 162 may have a thickness of several ten nanometers or greater and less than 5 µm.

The first organic insulating layer 164 is provided on the first inorganic insulating layer 162. The first organic insulating layer 164 is formed of an organic insulating material such as acrylic resin, epoxy resin, polyimide resin or the like. The first organic insulating layer 164 may have a thickness of 5 µm or greater and less than 20 µm. An end of the first organic insulating layer 164 is in the peripheral region 104.

The second organic insulating layer 166 covers the first organic insulating layer 164. Like the first organic insulating layer 164, the second organic insulating layer 166 is formed of an organic insulating material such as acrylic-based resin, epoxy-based resin, polyimide resin or the like. The second organic insulating layer 166 may have a thickness smaller than that of the first organic insulating layer 164. The thickness of the second organic insulating layer 166 may be 1 µm or greater and less than 5 µm. An end of the second organic insulating layer 166 is outer to the end of the first organic insulating layer 164. The end of the second organic insulating layer 166 has a tapering shape defined by a bottom surface D2 and a side surface S2. The end of the first organic insulating layer 164 has a tapering shape defined by a bottom surface D1 and a side surface S1. A tapering angle T2 of the tapering shape of the second organic insulating layer 166 (the tapering angle T2 is the angle made by the side surface S2 at the end of the second organic insulating layer 166 and the bottom surface D2 in direct contact with the first inorganic insulating layer 162 provided below the second organic insulating layer 166) is smaller than a tapering angle T1 of the tapering shape of the first organic insulating layer 164 (the tapering angle T1 is the angle made by the side surface S1 at the end of the first organic insulating layer 164 and the bottom surface D1 in direct contact with the first inorganic insulating layer 162 provided below the first organic insulating layer 164).

The second organic insulating layer 166 may contain a compound reactive with water or oxygen. The compound reactive with water or oxygen may be a pigment that is colored as a result of reacting with water or a compound that is colored as a result of reacting with oxygen. Examples of the pigment colored as a result of reacting with water include phenolphthalein, thymolphthalein, sodium carbonate and the like. Example of the compound colored as a result of reacting with oxygen include indigocarmine, methylene blue and the like. In the case where any of the above-listed compounds reactive with water or oxygen is contained, a defect in the sealing layer 161 is easily detected. As a material reactive with water, an alkaline metal material or an alkaline earth metal material may be used instead of the pigment.

The second inorganic insulating layer 168 covers the second organic insulating layer 166. The second inorganic insulating layer 168 is in contact with the first inorganic insulating layer 162. The second inorganic insulating layer 168 may be formed of substantially the same material as that of the first inorganic insulating layer 162.

The second inorganic insulating layer 168 is located to be in contact with the first inorganic insulating layer 162, so that the effect of blocking moisture is improved. As described above, the tapering angle T2 of the end of the second organic insulating layer 166 is smaller than the tapering angle T1 of the end of the first organic insulating layer 164, so that the coverage of the second inorganic insulating layer 168 is improved. This suppresses generation of a defect in the second inorganic insulating layer 168, and further improves the effect of blocking moisture. Therefore, the display device 10 provides a sufficient level of sealing performance of preventing entrance of moisture.

1-3. Structures of the Other Components of the Display Device Hereinafter, other components of the display device 10 will be described. The first substrate 100 and the second substrate 101 are formed of glass or an organic resin material. The organic resin material is, for example, polyimide. The first substrate 100 and the second substrate 101 may each have a cover glass, a protective film or the like provided on a second surface thereof (outer surface of each of the first substrate 100 and the second substrate 101 in the cross-sectional view as in FIG. 2).

The insulating layer 141 has a function of an underlying layer. The insulating layer 141 is formed of silicon oxide, silicon oxide nitride, silicon nitride, silicon nitride oxide or the like. The insulating layer 141 may have a single-film structure or a stack structure of a plurality of films.

The transistor 110 includes a semiconductor layer 142, a gate insulating layer 143, a gate electrode layer 145, a source and drain electrode layer 147, and the like. In the case of having both of an n-channel and a p-channel, the transistor 110 may have a CMOS structure.

The semiconductor layer 142 is formed of silicon, silicon germanium, an oxide semiconductor, an organic semiconductor or the like. Examples of usable type of silicon include amorphous silicon, polycrystalline silicon, and the like. The oxide semiconductor may be, for example, an oxide containing indium, gallium and zinc (IGZO).

The gate insulating layer 143 is formed of a material having a high dielectric constant such as silicon oxide, silicon oxide nitride, silicon nitride oxide, silicon nitride, or the like.

The insulating layer 149 is located on the gate insulating layer 143. The insulating layer 154 is used for the capacitance element 122. The insulating layer 149 and the insulating layer 154 are each formed of substantially the same material as that of the insulating layer 141 or the gate insulating layer 143. The insulating layer 149 and the insulating layer 154 may each have a single-film structure or a stack structure of a plurality of films of any of the above-listed materials.

The gate electrode layer 145 is formed of a metal element selected from tungsten, aluminum, chromium, copper, titanium, tantalum, molybdenum; an alloy containing any of the above-listed metal elements; an alloy of a combination of any of the above-listed metal elements; or the like. The gate electrode layer 145 may contain nitrogen, oxygen, hydrogen or the like. The gate electrode layer 145 may have a stack structure of any of the above-listed materials. The source and drain electrode layer 147 is formed of substantially the same material as that of the gate electrode layer 145.

The insulating layer 150 has a function of a flattening layer. The insulating layer 150 is formed of an organic insulating material, an inorganic insulating material, or a stack of an organic insulating material and an inorganic insulating material. The insulating layer 150 may have a side surface in the peripheral region 104.

The conductive layer 153 is used for the capacitance element 122. The conductive layer 153 is formed of substantially the same material as that of the gate electrode layer 145 or the source and drain electrode layer 147.

The capacitance element 120 is provided in a region where a source/drain region of the semiconductor layer 142 and a conductive layer 146 provided in the same layer as the gate electrode layer 145 overlap each other, with the gate insulating layer 143 being used as a dielectric layer. The capacitance element 122 includes the insulating layer 154 as a dielectric element and also includes the conductive layer 153 and a pixel electrode 155.

The display element 130 may be an organic EL element. The display element 130 includes the conductive layer 155, an organic EL layer 159 and a conductive layer 160. In this embodiment, the display element 130 has a so-called top emission structure, in which light emitted by the organic EL layer 159 is output toward the conductive layer 160.

The conductive layer 155 has a function of a pixel electrode and preferably has a property of reflecting light. The conductive layer 155 may be formed of, for example, a light-reflective metal material such as aluminum (Al), silver (Ag) or the like. The conductive layer 155 may have a stack structure of a transparent conductive layer of ITO (Indium Tin Oxide) or IZO (Indium Zinc Oxide) having a superb property of injecting holes and a light-reflective metal layer.

The organic EL layer 159 is formed of a light emitting material such as an organic electroluminescence material or the like. The organic EL layer 159 is formed of a low molecular weight-type or high molecular weight-type organic material. Although not shown, the organic EL layer 159, which includes a light emitting layer containing a light emitting organic material, may also include a hole injection layer and an electron injection layer sandwiching the light emitting layer, and may further include, for example, a hole transfer layer and an electron transfer layer sandwiching the light emitting layer.

The conductive layer 160 is formed of a material that is conductive and also light-transmissive in order to transmit light emitted in the organic EL layer 159. The conductive layer 160 is formed of a thin film of an alloy of silver (Ag) and magnesium (Mg). The conductive layer 160 may be formed of a transparent conductive film of ITO, IZO or the like.

The rib 157 is provided to cover a peripheral portion of the conductive layer 155 and also to form a smooth stepped portion at an end of the conductive layer 155. The rib 157 may be formed of an organic resin material. The rib 157 may be formed of, for example, acrylic resin, polyimide resin or the like. The rib 157 may have a side surface in the peripheral region 104. The side surface of the rib 157 is covered with the first inorganic insulating layer 162.

The filling member 174 is formed of an inorganic material, an organic material or a composite material of an organic material and an inorganic material. The filling member 174 is formed of, for example, epoxy resin, acrylic resin or the like.

1-4. Method for Manufacturing the Display Device

Hereinafter, a method for manufacturing the display device 10 will be described with reference to FIG. 3 to FIG. 12.

Figure 3:
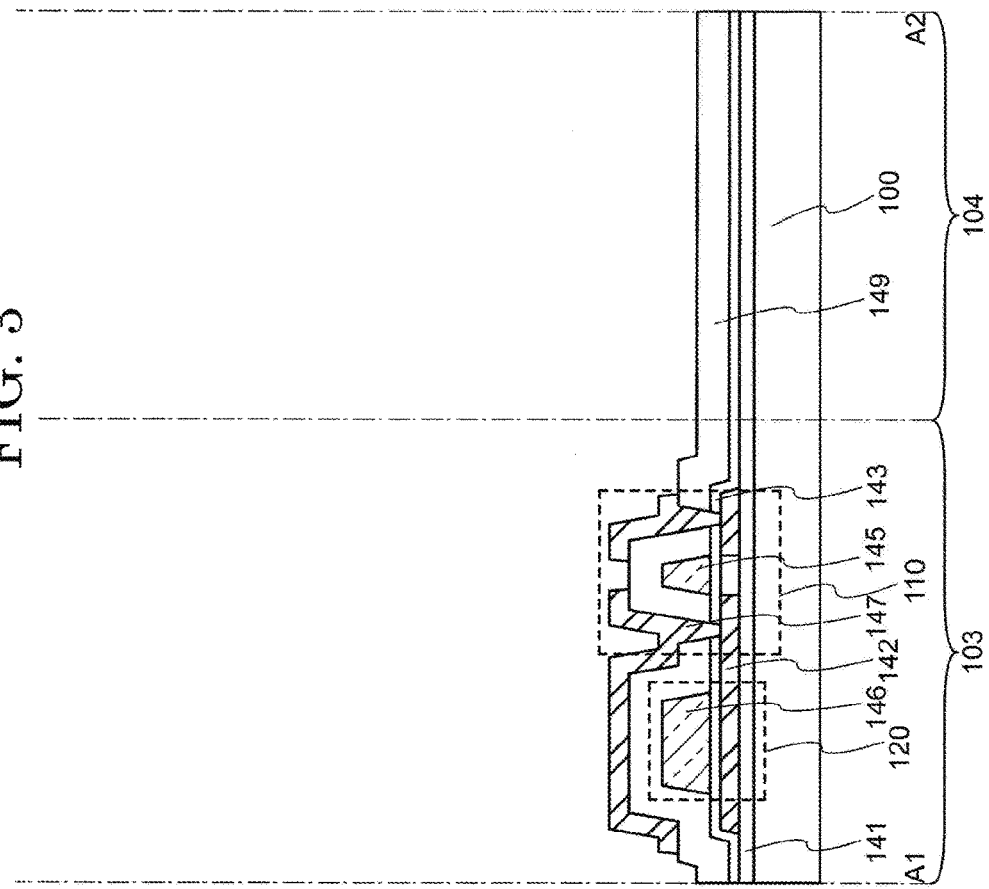
FIG. 3 is a cross-sectional view showing a method for manufacturing the display device in an embodiment according to the present invention.

First, as shown in FIG. 3, the following components are formed on a first surface of the first substrate 100 (top surface of the first substrate 100 in the cross-sectional view as in FIG. 2): the insulating layer 141, the transistor 110 (including the semiconductor layer 142, the gate insulating layer 143 and the gate electrode layer 145), the capacitance element 120 (including the conductive layer 146, the gate insulating layer 143 and the source/drain region of the semiconductor layer 142), the source and drain electrode layer 147, the insulating layer 149 and the insulating layer 150.

The semiconductor layer 142, the gate electrode layer 145, and the source and drain electrode layer 147 are formed by chemical vapor deposition (CVD), sputtering, vacuum vapor deposition or the like. The semiconductor layer 142, the gate electrode layer 145, and the source and drain electrode layer 147 are each processed into a desired shape by photolithography, nanoimprinting, ink-jet method, etching or the like optionally. The inkjet method refers to a method in which droplets are continuously dropped from a nozzle and deposited and solidified to form a thin film.

The insulating layer 141, the gate insulating layer 143, and the insulating layer 149 are formed of CVD, sputtering, vacuum vapor deposition, spin-coating or the like.

The insulating layer 150 is formed by spin-coating, ink-jet method, lamination, dip-coating or the like. The insulating layer 150 may be processed so as to have the side surface in the peripheral region 104.

Figure 4:
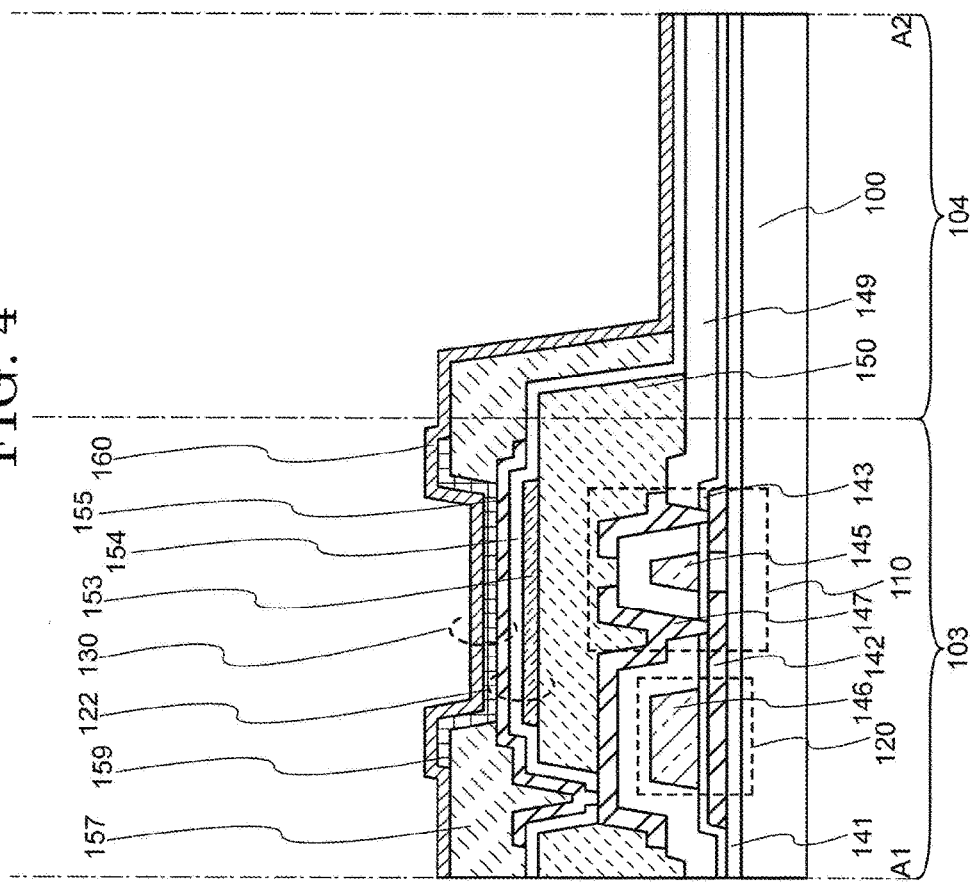
FIG. 4 is a cross-sectional view showing the method for manufacturing the display device in an embodiment according to the present invention.

Next, as shown in FIG. 4, the following components are formed on the insulating layer 150: the capacitance element 122 (including the conductive layer 153, the insulating layer 154 and the conductive layer 155), the display element 130 (including the conductive layer 155, the organic EL layer 159 and the conductive layer 160), and the rib 157. These layers are each processed into a desired shape by photolithography, nanoimprinting, ink-jet method, etching or the like optionally.

The conductive layer 153, the conductive layer 155 and the conductive layer 160 are formed by sputtering, vacuum vapor deposition, plating or the like. The insulating layer 154 is formed by CVD (plasma CVD or thermal CVD), spin-coating, printing or the like.

The rib 157 has an opening formed therein so as to expose a top surface of the organic EL layer 159. An end of the opening in the rib 157 may be formed to be mildly tapered. The rib 157 is processed to have the side surface in the peripheral region 104.

The organic EL layer 159 is formed to overlap at least the conductive layer 155. The organic EL layer 159 is formed by, for example, vacuum vapor deposition, printing, spin-coating or the like. In the case where the organic EL layer 159 is formed by vacuum vapor deposition, a shadow mask may be used so as to provide a region where the organic EL layer 159 is not formed. The organic EL layer 159 may be formed of a different material among pixels adjacent to each other, or may be formed of the same material in all the pixels.

Figure 5:
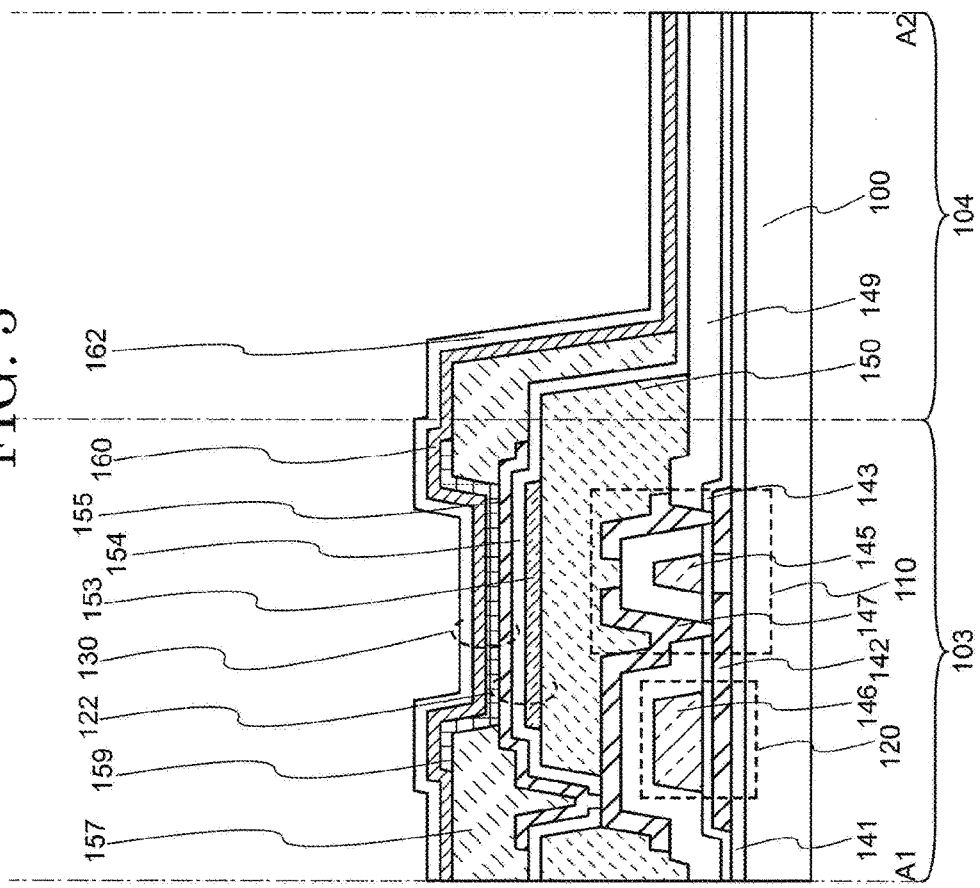
FIG. 5 is a cross-sectional view showing the method for manufacturing the display device in an embodiment according to the present invention.

Next, as shown in FIG. 5, the first inorganic insulating layer 162 is formed on the conductive layer 160. In this case, the first inorganic insulating layer 162 is formed to cover the display region 103. The first inorganic insulating layer 162 is formed by CVD, vacuum vapor deposition, sputtering or the like. The first inorganic insulating layer 162 is formed of aluminum oxide, magnesium oxide, silicon oxide, silicon oxide nitride, silicon nitride oxide, silicon nitride or the like. For example, the first inorganic insulating layer 162 may be formed of silicon nitride by plasma CVD.

Figure 6:
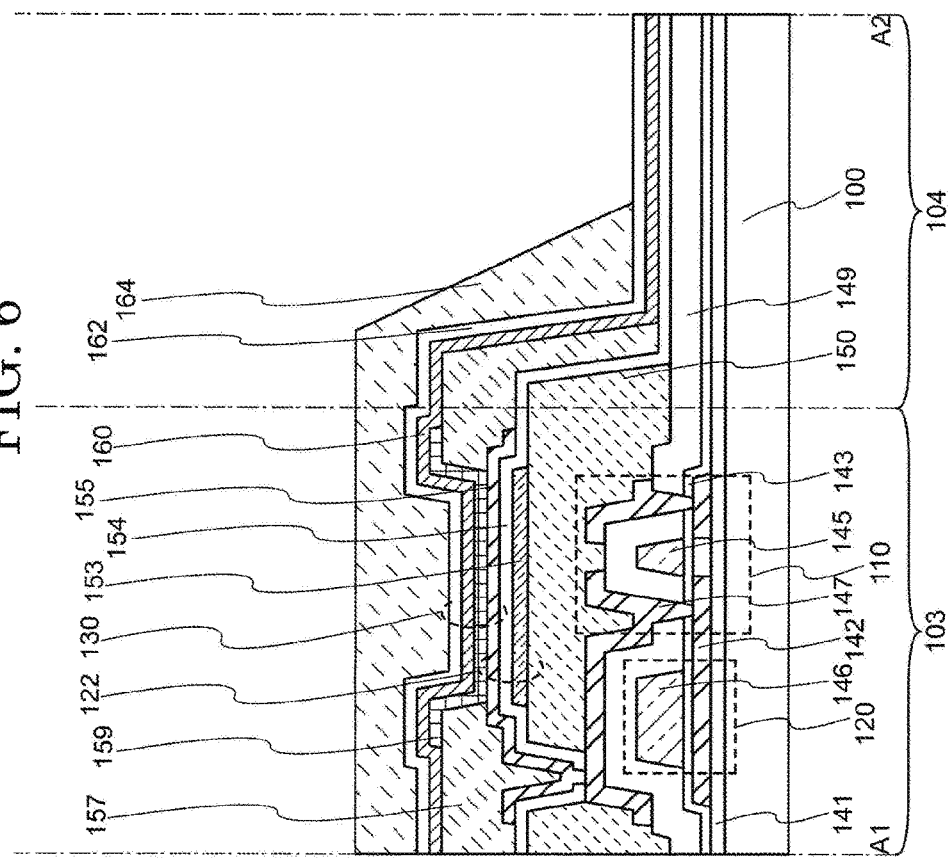
FIG. 6 is a cross-sectional view showing the method for manufacturing the display device in an embodiment according to the present invention.
Figure 7:
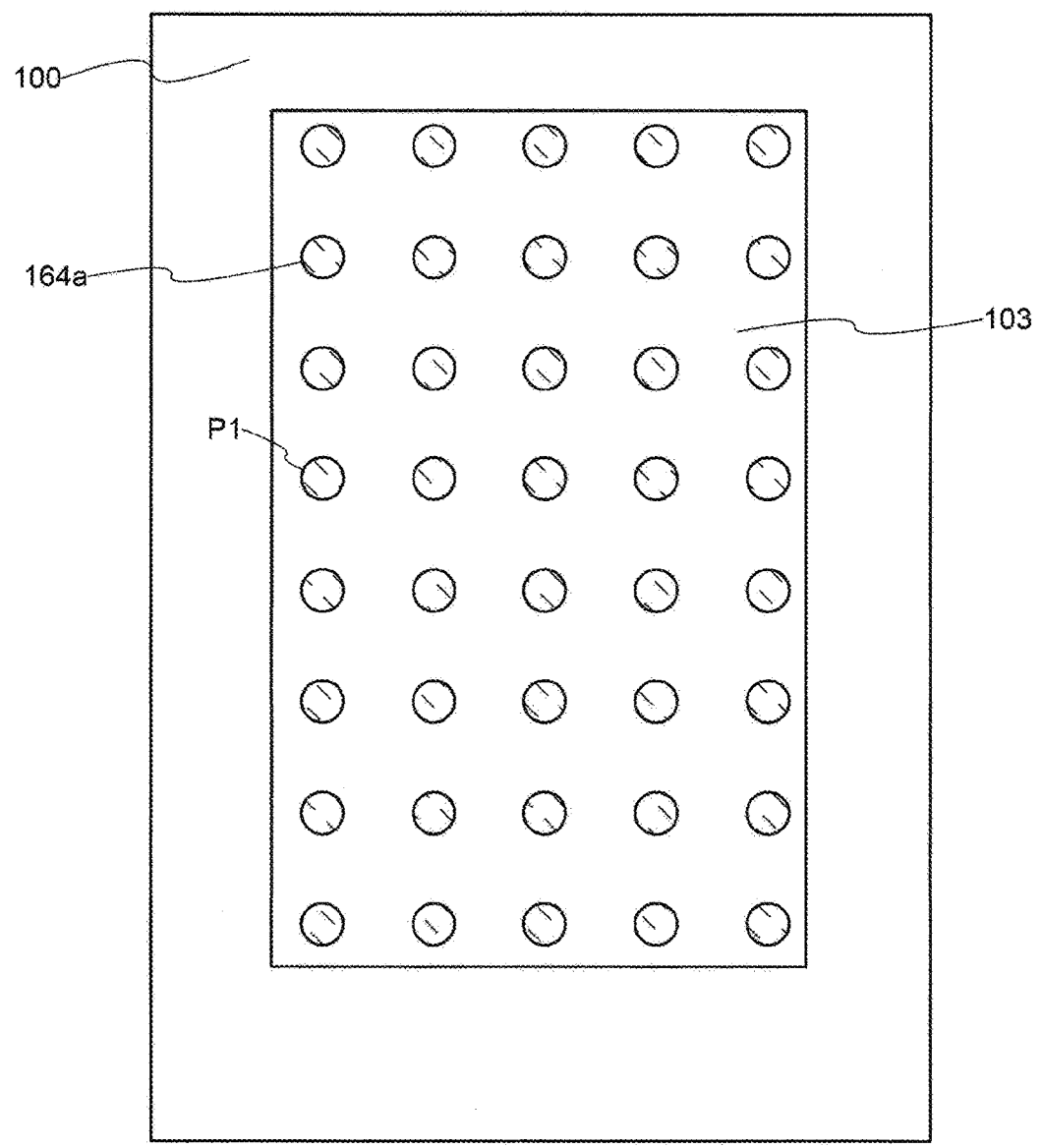
FIG. 7 is a plan view showing the method for manufacturing the display device in an embodiment according to the present invention.

Next, as shown in FIG. 6, the first organic insulating layer 164 is formed on the first inorganic insulating layer 162. The first organic insulating layer 164 may be formed by screen printing or ink-jet method. In the case where, for example, the first organic insulating layer 164 is formed by ink-jet method, as shown in FIG. 7, a first organic material (ink 164a) that is to form the first organic insulating layer 164 is injected to injection positions P1. The ink 164a is formed of acrylic-based resin or epoxy-based resin. The injected ink 164a wet-spreads to cover the display region 103. The injection amount of the ink 164a may be appropriately set in the range of several picoliters to several ten picoliters. For example, the injection amount of the ink 164a may be 14 picoliters.

Figure 8:
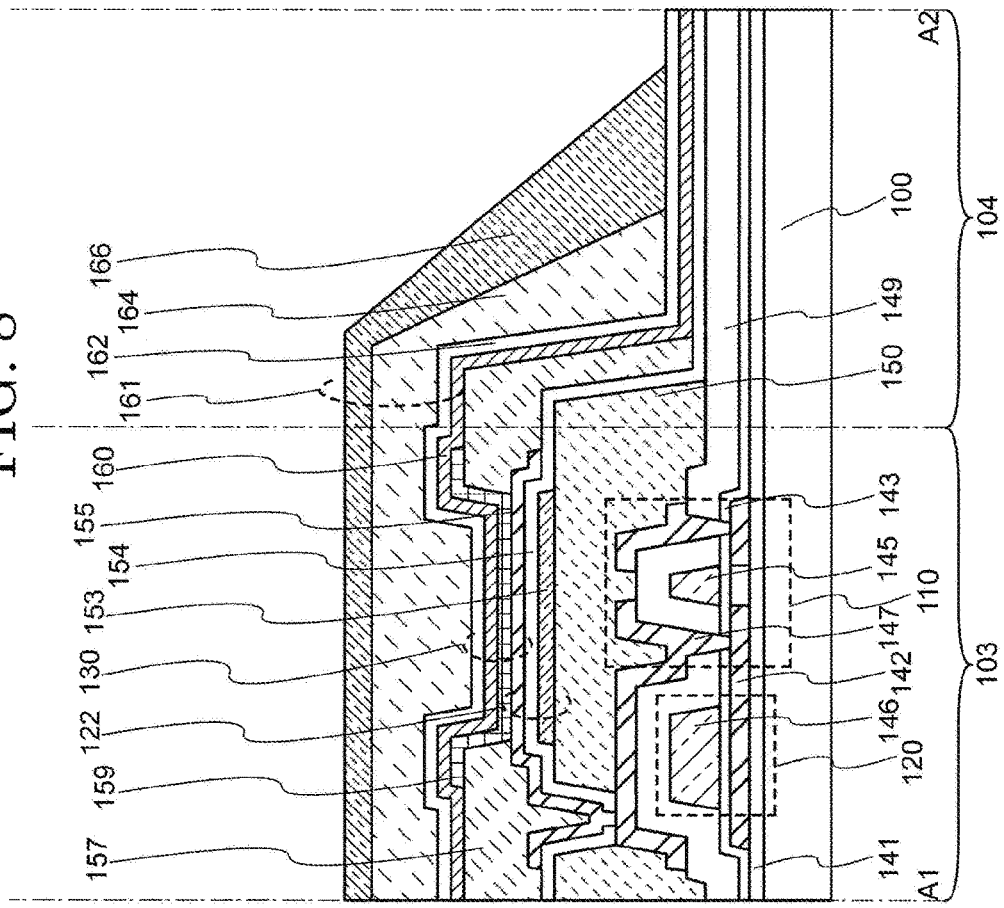
FIG. 8 is a cross-sectional view showing the method for manufacturing the display device in an embodiment according to the present invention.
Figure 9:
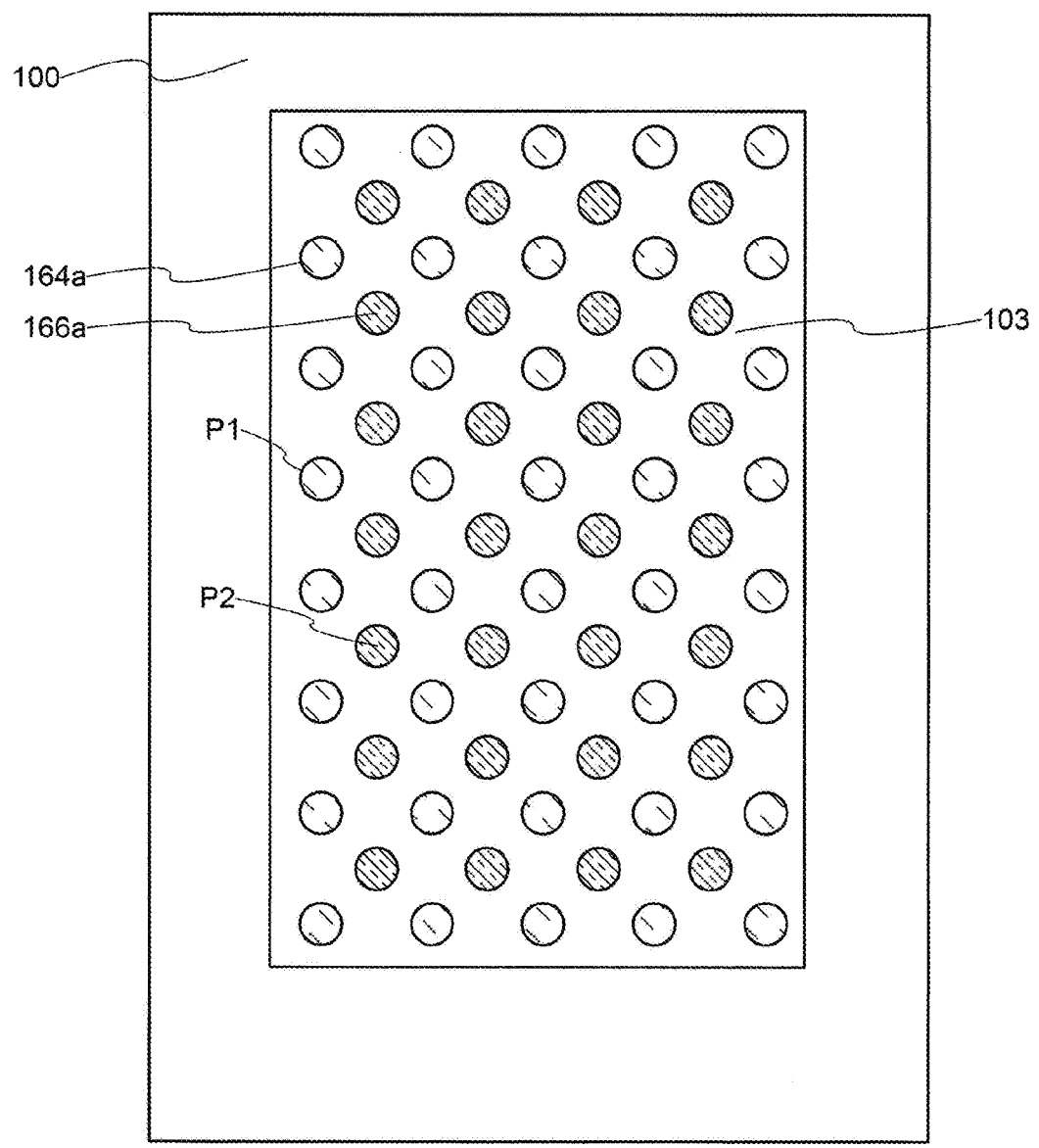
FIG. 9 is a plan view showing the method for manufacturing the display device in an embodiment according to the present invention.

Next, as shown in FIG. 8, the second organic insulating layer 166 is formed on the first organic insulating layer 164. The second organic insulating layer 166 may be formed by ink-jet method. The second organic insulating layer 166 may be formed of the same material as, or a different material form, that of the first organic insulating layer 164. In the case where, for example, the second organic insulating layer 166 is formed by ink-jet method, as shown in FIG. 9, a second organic material (ink 166a) that is to form the second organic insulating layer 166 is injected to injection positions P2 different from the injection positions P1. The ink 166a may be formed of the same material as, or a different material from, that of the ink 164a. The ink 166a may be formed of, for example, acrylic-based resin or epoxy-based resin. The injected ink 166a wet-spreads to cover the first organic insulating layer 164. The injection amount of the ink 166a may be appropriately set in the range of several picoliters to several ten picoliters. For example, the injection amount of the ink 166a may be 14 picoliters.

Figure 10:
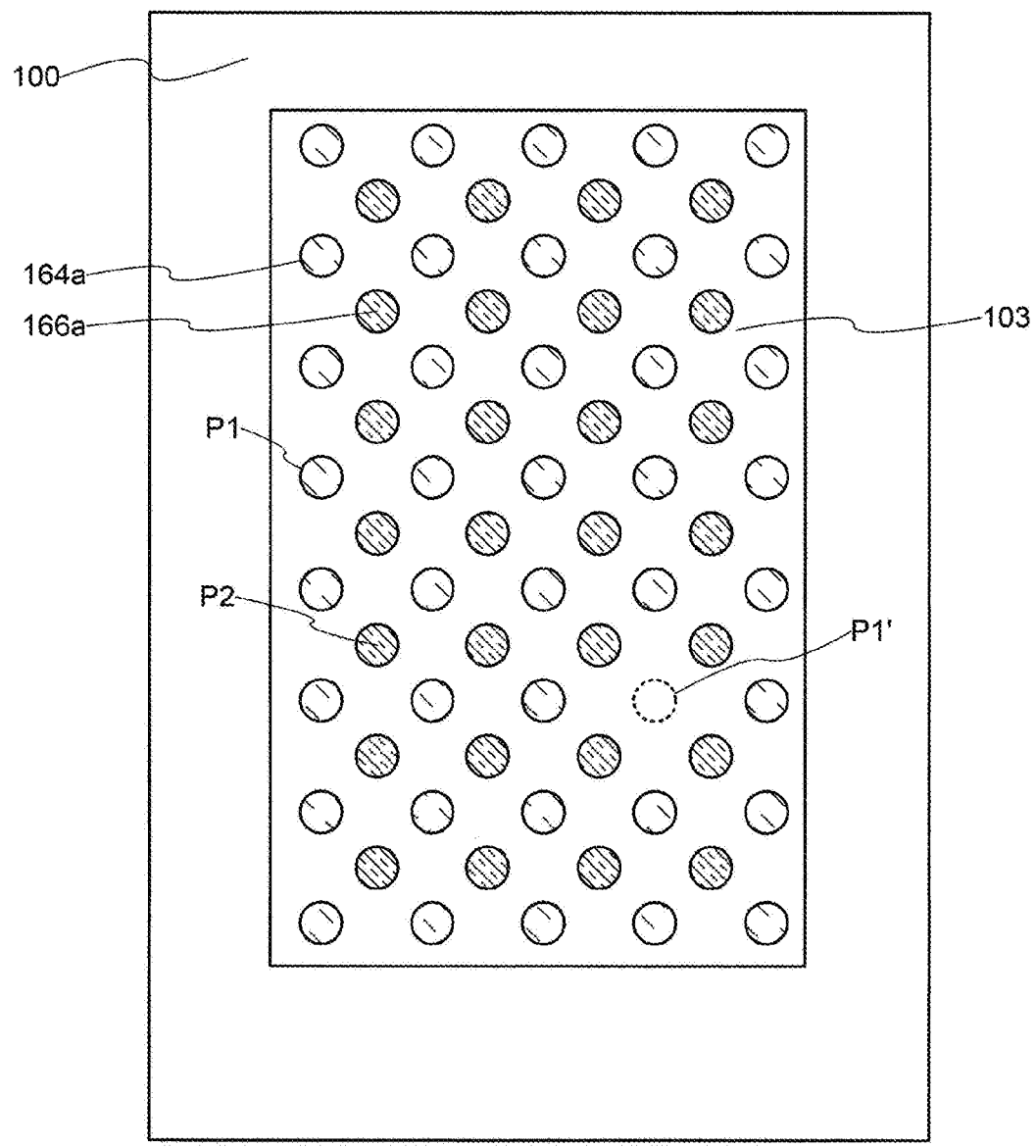
FIG. 10 is a plan view showing the method for manufacturing the display device in an embodiment according to the present invention.

The ink 166a has a viscosity lower than that of the ink 164a. For example, the viscosity of the ink 164a at the time of formation of the first organic insulating layer 164 may be 10 mPa·s or greater and less than 50 mPa·s, whereas the viscosity of the ink 166a at the time of formation of the second organic insulating layer 166 may be 1 mPa·s or greater and less than 10 mPa·s. Thus, the ink 166a more easily wet-spreads than the ink 164a. Even if, for example, as shown in FIG. 10, the ink 164a is not injected toward an injection position P1' and surface ruggedness occurs, the ruggedness is easily flattened by the ink 166a. Therefore, the flatness of the sealing layer 161 is improved.

The temperature of the first substrate 100 or the ink 166a at the time of formation of the second organic insulating layer 166 may be higher than the temperature of the first substrate 100 or the ink 164a at the time of formation of the first organic insulating layer 164. In this case, the viscosity of the ink 166a is further decreased, and thus the ink 166a wet-spreads more easily. This allows the ruggedness to be further flattened by the second organic insulating layer 166. As a result, the flatness of the sealing layer 161 is further improved.

The first organic insulating layer 164 may be cured before the second organic insulating layer 166 is formed. A surface of the first organic insulating layer 164 may be plasma-treated before the second organic insulating layer 166 is formed. Such a treatment improves the quality of the surface of the first organic insulating layer 164, and thus the contact angle of the ink 166a is decreased. This allows the ink 166a to wet-spread more easily, and the ruggedness is further flattened by the second organic insulating layer 166.

Figure 11:
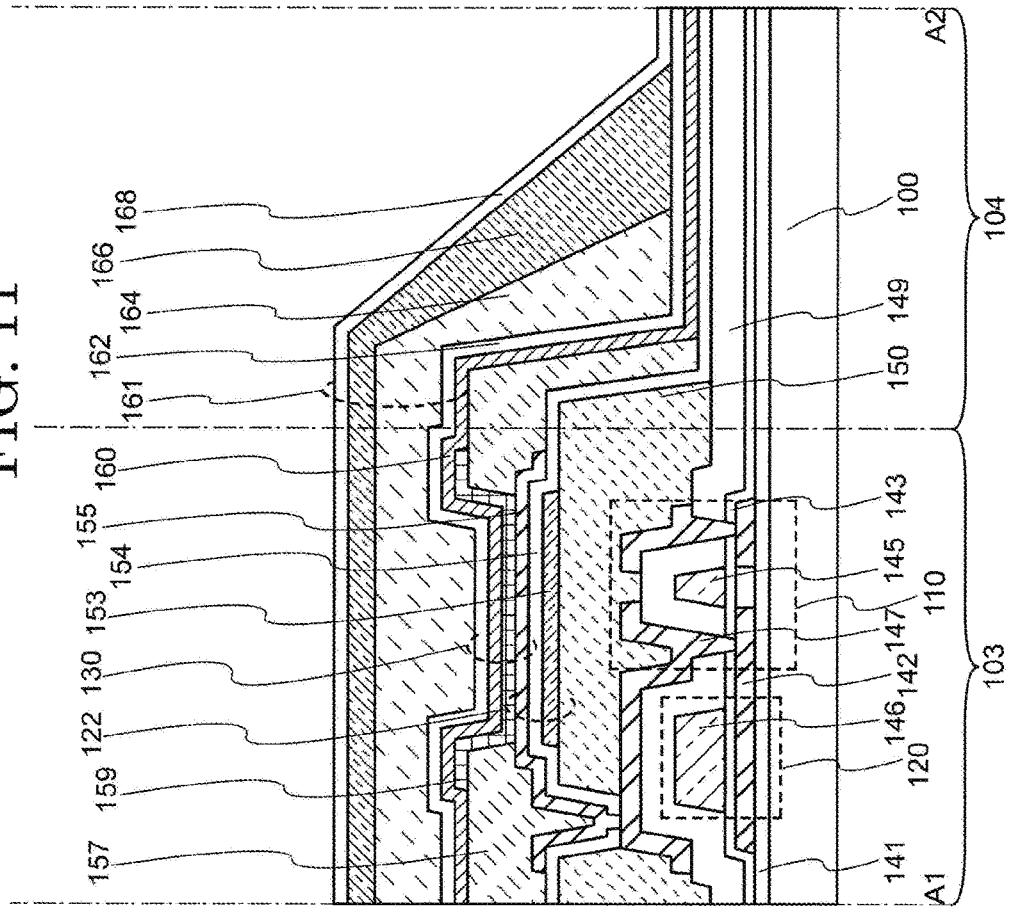
FIG. 11 is a cross-sectional view showing the method for manufacturing the display device in an embodiment according to the present invention.

Next, as shown in FIG. 11, the second inorganic insulating layer 168 is formed to cover the second organic insulating layer 166. The second inorganic insulating layer 168 is formed of substantially the same material as that of, by substantially the same method as that of, the first inorganic insulating layer 162. For example, the second inorganic insulating layer 168 may be formed of a stack structure of silicon oxide and silicon nitride by plasma CVD. Since the ruggedness is alleviated by the second organic insulating layer 166, the generation of a defect is suppressed at the time of formation of the second inorganic insulating layer 168.

The second inorganic insulating layer 168 is formed to be in contact with the first inorganic insulating layer 162. As a result of such an arrangement, the first organic insulating layer 164 and the second organic insulating layer 166 are between the first inorganic insulating layer 162 and the second inorganic insulating layer 168 in the peripheral region 104. Therefore, the sealing layer 161 blocks moisture more easily. The region where the first organic insulating layer 164 and the second organic insulating layer 166 are between the first inorganic insulating layer 162 and the second inorganic insulating layer 168 acts as a moisture blocking region, and this structure may be referred to as a "moisture blocking structure". This structure prevents entrance of moisture to the display element 130. Therefore, the sealing layer 161 provides a high sealing performance.

Figure 12:
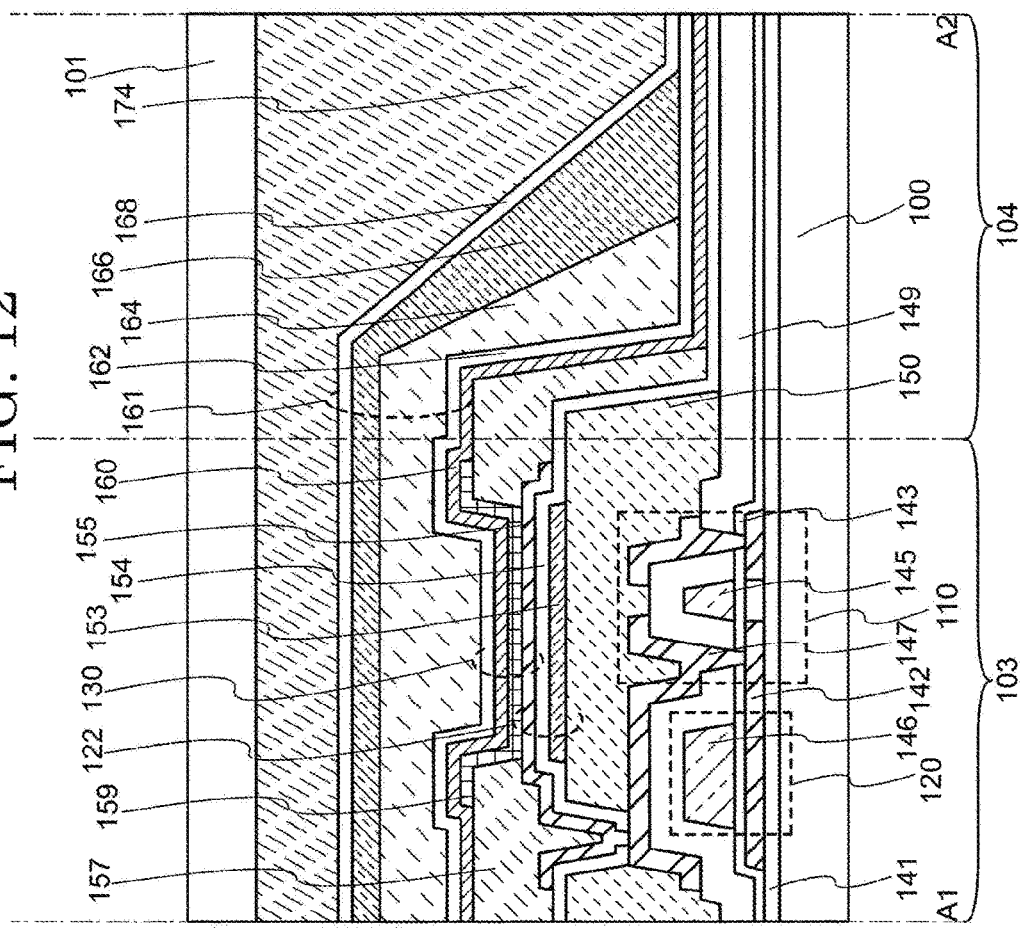
FIG. 12 is a cross-sectional view showing the method for manufacturing the display device in an embodiment according to the present invention.

In a final step, as shown in FIG. 12, the first substrate 100 and the second substrate 101 are bonded with the filling member 174. The filling member 174 may be formed of a photocurable adhesive. The photocurable adhesive is cured quickly and thus shortens the operation time.

The display device 10 manufactured by the above-described manufacturing method has improved flatness of the sealing layer 161 and provides a high performance of preventing entrance of moisture to the display element 130.

<Embodiment 2>

Hereinafter, a display device having a different structure from that of the display device 10 in embodiment 1 will be described. Regarding the structures, the materials and the method that are the same as those in embodiment 1, the descriptions in embodiment 1 are applied and the same descriptions will not be repeated.

Figure 13:
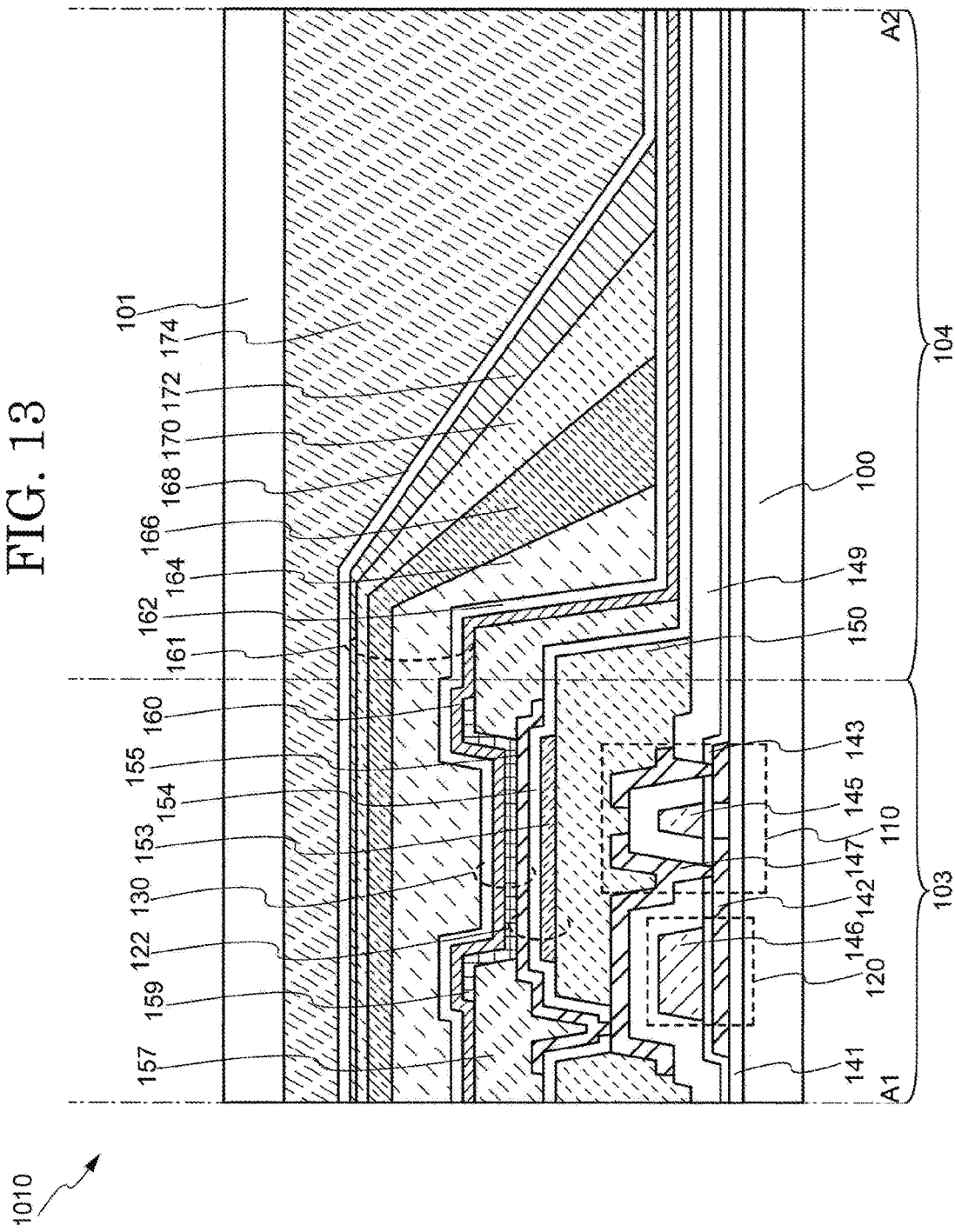
FIG. 13 is a cross-sectional view of a display device in an embodiment according to the present invention.

FIG. 13 is a cross-sectional view of a display device 1010 in embodiment 2. As shown in FIG. 13, like the display device 10, the display device 1010 includes the first substrate 100, the insulating layer 141, the transistor 110, the capacitance element 120, the capacitance element 122, the display element 130, the insulating layer 150, the rib 157, the sealing layer 161, the filling member 174, and the second substrate 101. In display device 1010, the sealing layer 161 includes the first inorganic insulating layer 162, the first organic insulating layer 164, the second organic insulating layer 166 and the second inorganic insulating layer 168, and further includes a third organic insulating layer 170 and a fourth organic insulating layer 172. The display device 1010 includes the third organic insulating layer 170 and the fourth organic insulating layer 172 to further improve the flatness of the sealing layer 161. This further suppresses generation of a defect in the second inorganic insulating layer 168. Since the second inorganic insulating layer 168 does not have a defect, entrance of moisture to the display element 130 is further suppressed. As a result, the display device 1010 has further improved flatness of the sealing layer 161 and provides a higher performance of preventing entrance of moisture to the display element 130.

(Modifications)

In the above-described embodiments, the present invention is applied to an organic EL display device as an example. The present invention is also applicable to a liquid crystal display device, any other self-light emitting display device, an electronic paper-type display device including an electrophoretic display element or the like, or any other flat panel display device.

Figure 14:
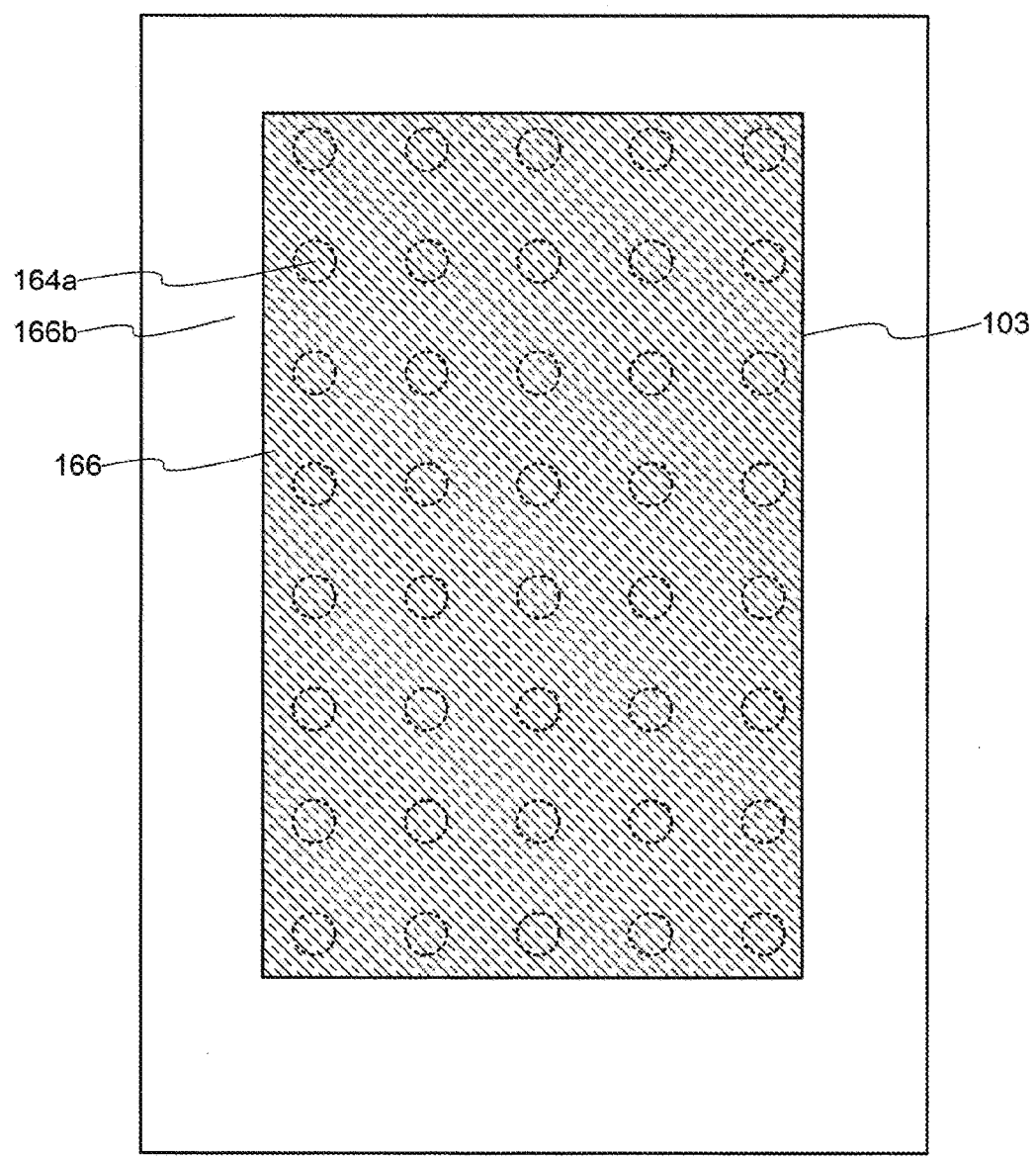
FIG. 14 is a plan view showing a method for manufacturing the display device in an embodiment according to the present invention.

In the above-described embodiments, the second organic insulating layer 166 is formed by ink-jet method. Alternatively, the second organic insulating layer 166 may be formed by screen printing or vapor deposition. In the case where the second organic insulating layer 166 is formed by vapor deposition, as shown in FIG. 14, a mask 166b or the like may be used such that the second organic insulating layer 166 is formed only in the display region 103.

Figure 15:
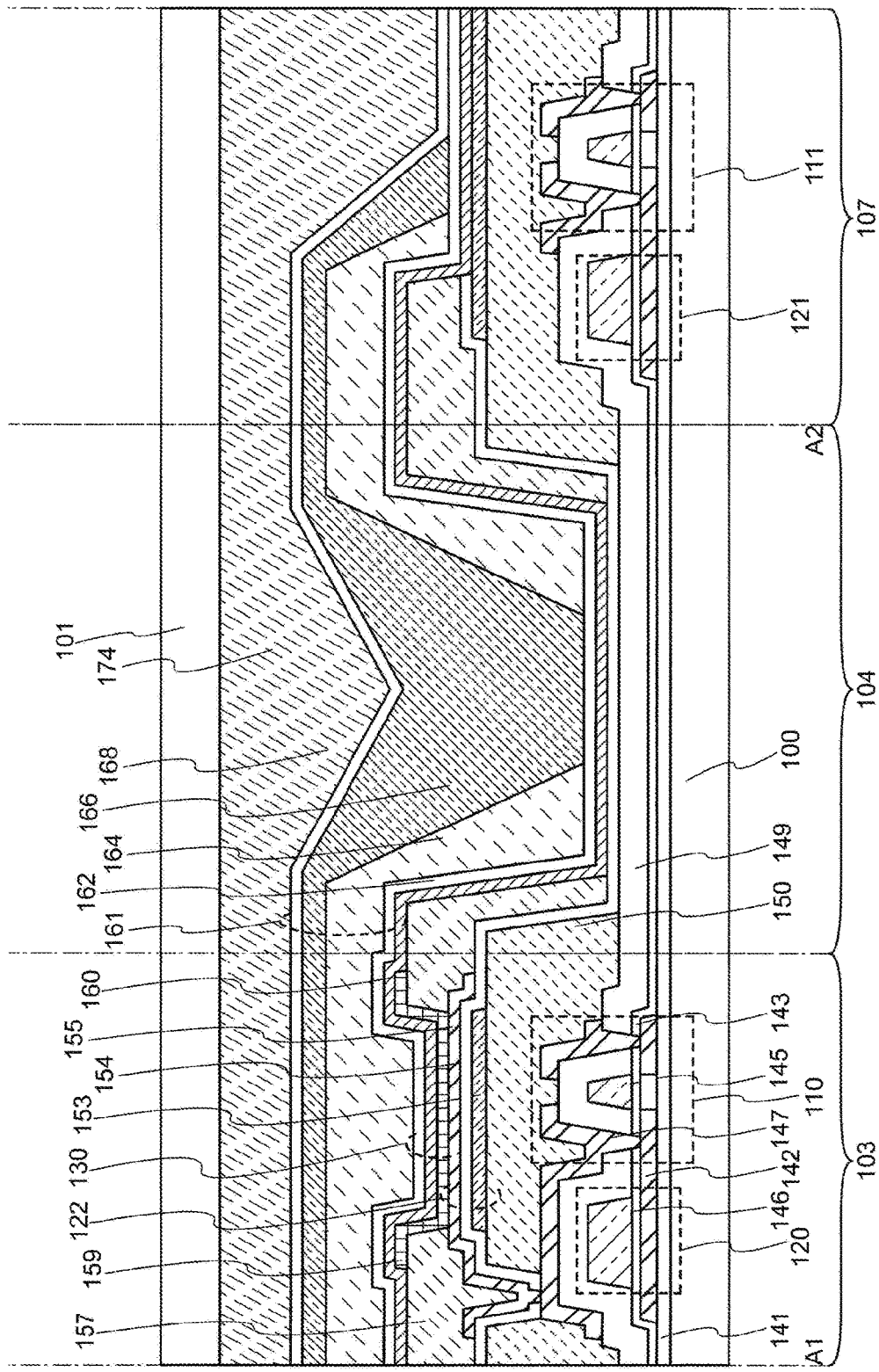
FIG. 15 is a cross-sectional view of a display device in an embodiment according to the present invention.

In the above-described embodiments, the end of the second organic insulating layer 166 in the sealing layer 161 is located in the peripheral region 104. FIG. 15 is a cross-sectional view of a modification of the display device 10. As shown in FIG. 15, alternatively, the end of the second organic insulating layer 166 in the sealing layer 161 may be located in the driving circuit 107. The driving circuit 107 includes a transistor, a capacitance element (not shown) and the like. The ruggedness caused in the peripheral region 104 is flattened by the second organic insulating layer 166. Thus, a defect is not easily generated at the time of formation of the second inorganic insulating layer 168. This improves the sealing performance of the sealing layer 161.

A person of ordinary skill in the art would readily conceive various alterations or modifications of the present invention, and such alterations and modifications are construed as being encompassed in the scope of the present invention. For example, the display devices in the above-described embodiments may have an element added thereto, or deleted therefrom, or may be changed in design optionally by a person of ordinary skill in the art. The methods in the above-described embodiments may have a step added thereto, or deleted therefrom, or may be changed in the condition optionally by a person of ordinary skill in the art. Such devices and methods are encompassed in the scope of the present invention as long as including the gist of the present invention.

What is claimed is:

1. A display device, comprising:
   a first inorganic insulating layer covering a display region;
   a first organic insulating layer on the first inorganic insulating layer;
   a second organic insulating layer covering the first organic insulating layer; and
   a second inorganic insulating layer covering the second organic insulating layer, the second inorganic insulating layer including a region in contact with the first inorganic insulating layer,
   wherein
   an end of the first organic insulating layer and an end of the second organic insulating layer each have a tapering shape,
   the first organic insulating layer has a first side surface located at the end of the first organic insulating layer and a first bottom surface in direct contact with a layer below the first organic insulating layer,
   the second organic insulating layer has a second side surface located at the end of the second organic insulating layer and a second bottom surface in direct contact with a layer below the second organic insulating layer, and an angle between the second side surface and the second bottom surface is smaller than an angle between the first side surface and the first bottom surface.

2. The display device according to claim 1, wherein the end of the second organic insulating layer is outer to the end of the first organic insulating layer.

3. The display device according to claim 1, wherein the second organic insulating layer has a thickness smaller than a thickness of the first organic insulating layer.

4. The display device according to claim 1, wherein the second organic insulating layer contains a compound reactive with water or oxygen.

5. The display device according to claim 4, wherein the compound is phenolphthalein or sodium carbonate.

6. The display device according to claim 1, wherein
the display region includes a plurality of display elements,
the display elements are each an organic EL element including a light emitting layer, and
the first inorganic insulating layer, the first organic insulating layer, the second organic insulating layer and the second inorganic insulating layer cover the plurality of display elements.

7. The display device according to claim 1, wherein the region in contact with the first inorganic insulating layer is outer to the display region, and is at a position on a side opposite to the display region with respect to the end of the first organic insulating layer and on a side opposite to the display region with respect to the end of the second organic insulating layer.

8. A method for manufacturing a display device, the method comprising:
forming a first inorganic insulating layer such that the first inorganic insulating layer covers a display region;
forming a first organic insulating layer on the first inorganic insulating layer, the first organic insulating layer being formed of a first organic material;
forming a second organic insulating layer on the first organic insulating layer such that the second organic insulating layer covers the first organic insulating layer, the second organic insulating layer being formed of a second organic material having a viscosity lower than a viscosity of the first organic material; and
forming a second inorganic insulating layer covering the second organic insulating layer, wherein
the first organic insulating layer is cured before the second organic insulating layer is formed.

9. The method for manufacturing a display device according to claim 8, wherein
the viscosity of the first organic material is 10 mPa·s or greater and less than 50 mPa·s, and the viscosity of the second organic material is 1 mPa·s or greater and less than 10 mPa·s.

10. The method for manufacturing a display device according to claim 8, wherein the first organic insulating layer and the second organic insulating layer are formed by ink-jet method.

11. The method for manufacturing a display device according to claim 10, wherein the first organic material and the second organic material are injected to different injection positions from each other.

12. The method for manufacturing a display device according to claim 8, wherein a temperature at the time of formation of the second organic insulating layer is higher than a temperature at the time of formation of the first organic insulating layer.

13. The method for manufacturing a display device according to claim 8, wherein a surface of the first organic insulating layer is plasma-treated before the second organic insulating layer is formed.

14. The method for manufacturing a display device according to claim 8, wherein the first organic material and the second organic material are the same as each other.

15. The method for manufacturing a display device according to claim 8, wherein the first organic material and the second organic material are different from each other.

16. The method for manufacturing a display device according to claim 8, wherein
the first organic insulating layer is formed by ink-jet method, and
the second organic insulating layer is formed by vacuum vapor deposition.

* * * * *